United States Patent [19]

Toyokuni

[11] 4,350,961
[45] Sep. 21, 1982

[54] ELECTRONIC TIMEPIECE
[75] Inventor: Ryo Toyokuni, Tokyo, Japan
[73] Assignee: Kabushiki Kaisha Daini Seikosha, Japan
[21] Appl. No.: 89,462
[22] Filed: Oct. 30, 1979
[30] Foreign Application Priority Data
Nov. 10, 1978 [JP] Japan .................. 53-138564
[51] Int. Cl.³ .................................. H03F 1/30
[52] U.S. Cl. .................................. 331/158; 331/176
[58] Field of Search ............ 58/23 AC; 331/158, 175, 331/176; 368/200, 202, 155, 156, 157

[56] References Cited
U.S. PATENT DOCUMENTS

| B. 527,693 | 2/1976 | Waku | 331/176 |
| 2,256,931 | 9/1941 | Wolfskill | 331/158 |
| 4,109,456 | 8/1978 | Yamada et al. | 368/202 |
| 4,159,622 | 7/1979 | Akahane | 331/176 X |
| 4,223,524 | 9/1980 | Nakagawa | 331/176 |

FOREIGN PATENT DOCUMENTS

| 451243 | 9/1948 | Canada | 331/176 |
| 52-8757 | 1/1977 | Japan | 331/176 |

Primary Examiner—J. V. Truhe
Assistant Examiner—Forester W. Isen
Attorney, Agent, or Firm—Robert E. Burns; Emmanuel J. Lobato; Bruce L. Adams

[57] ABSTRACT

An electronic timepiece including an X-cut quartz crystal resonator and a capacitor to compensate the frequency-temperature characteristics of said quartz crystal resonator, wherein said capacitor comprises a plurality of ceramic capacitor elements having a different Temperature of Curie Point.

14 Claims, 11 Drawing Figures

ELECTRONIC TIMEPIECE

BACKGROUND OF THE INVENTION

The present invention relates to an electronic timepiece provided with a temperature compensating capacitor.

Conventionally, X-cut quartz crystal resonators have had the frequency-temperature characteristics with a negative secondary temperature coefficient as shown in FIG. 1, and the timepieces incorporating the X-cut quartz crystal resonators have delays or time loses of 1.4 to 1.5 seconds/day maximum, in the temperature range of room temperature ±20° C. even if the rate has been set at zero at room temperature. In order to improve the aberration of the rate, the frequency-temperature characteristics of the X-cut quartz crystal resonators have been compensated using a temperature compensating capacitor having a peak value at room temperature as shown in FIG. 2.

By the above compensation, the rate-temperature characteristics of the timepiece becomes plain as shown in FIG. 3 and the abberation of the rate is fixed around ±0.2 second/day maximum, at room temperature ±20° C.

However, it is very difficult to fix the abberation of the rate around ±0.1 second/day at room temperature ±20° C. by improving the rate-temperature characteristics of the capacitor because of the limitation of the capacitance-temperature characteristics of the temperature compensating capacitor.

Namely, the chief ingredient of the temperature compensating capacitor is generally BaTiO3, i.e., the Temperature of the Curie Point 120° C. may be transfered to room temperature by applying some secondary ingredient. As a result, the capacitance changes on a large scale as shown in FIG. 2 taking advantage of the phase transition at the Temperature of the Curie Point (referred as TC hereafter).

The secondry ingredients are BaSnO3, CaSnO3, BaZrO3, SrTiO3 and the like. The ferroelectric ceramics comprises mainly of BaTiO3 have different capacitance-temperature characteristics at the lower temperature side and the higher temperature side centering around TC, though the capacitance-temperature characteristics are different more or less according to each secondary ingredient.

FIG. 4 shows the capacitance-temperature characteristics of BaTiO3-BaSnO3, BaTiO3-CaSnO3 and BaTiO-SrTiO3. Comparing the capacitance value of the capacitor at TC+20° C. and at TC-20° C, the capacitance at TC+20° C. is larger than the capacitance at TC-20° C. by 20 to 30% (TC=24° C.) as shown in FIG. 4.

In the case that the temperature compensating capacitor having asymmetrical capacitance-temperature characteristics centering around TC is combined with the X-cut quartz crystal resonator having the frequency-temperature characteristics of the negative secondary temperature coefficient topped at the turn over point (referred to TP hereafter) as shown in FIG. 1, the temperature is not completely compensated since the frequency-temperature characteristics of the quartz crystal resonator is symmetrical centering around TP, whereby the rate at the lower temperature side advances and the rate at the higher temperature side delays or decreases as shown in FIG. 3.

SUMMARY OF THE INVENTION

It is an object of the present invention to provide the higher precision timepiece by incorporating two capacitor elements having different TC, combined as a single temperature compensating capacitor, into a timepiece body.

Hereafter the present invention will be discussed in detail in conjunction with the illustrated embodiments.

The temperature compensating capacitor is made from BaTiO3-SrTiO3 and manufactured by the ordinary ceramics manufacturing process. TC of this material is freely varied by adjusting the mol ratio of BaTiO3 and SrTiO3. The temperature compensating capacitor is manufactured by processing a ceramic disk having the predetermined characteristics into a number of ceramic chips of 2.0 mm×0.3 mm×0.3 mm and mounting electrodes on the chips.

DESCRIPTION OF THE PREFERRED EMBODIMENTS

Figure 1:
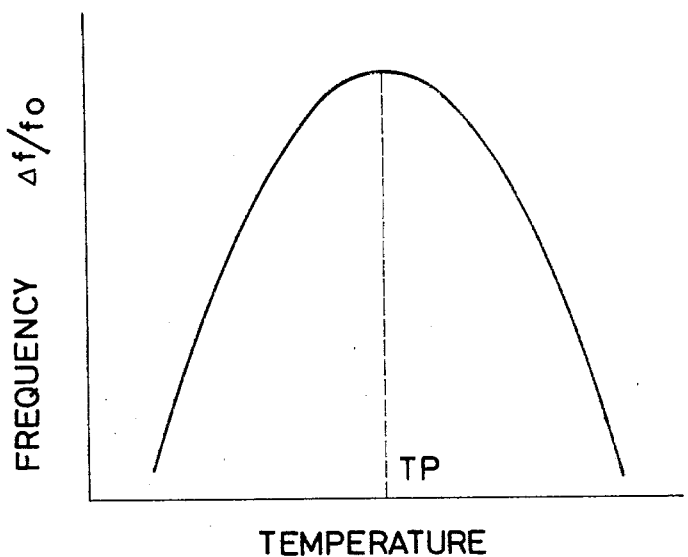
FIG. 1 is a characteristic diagram showing the frequency-temperature characteristics of an X-cut quartz crystal resonator.
Figure 2:
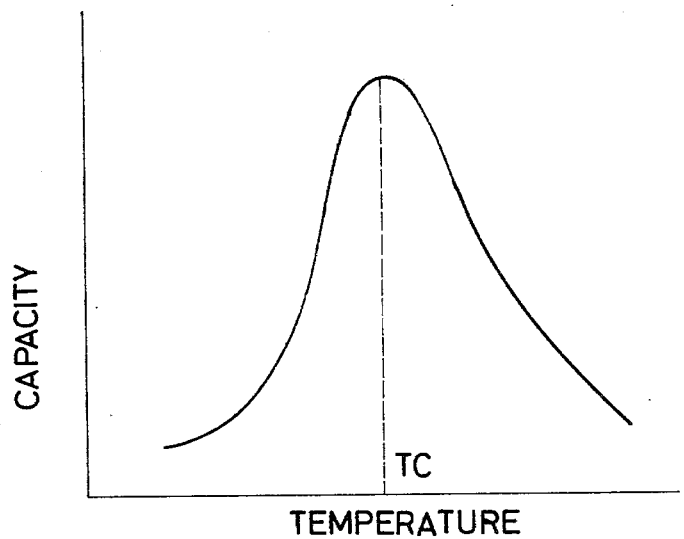
FIG. 2 is a characteristic diagram showing the capacitance temperature characteristics of a temperature compensating capacitor.
Figure 3:
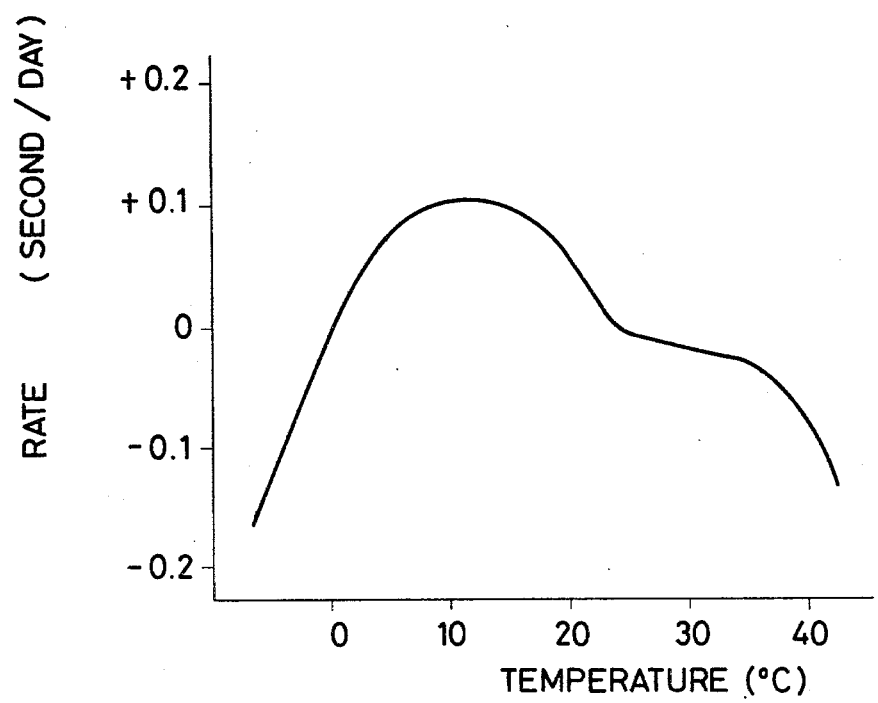
FIG. 3 is a characteristic diagram showing the rate-temperature characteristics of the conventional timepiece after compensation.
Figure 5:
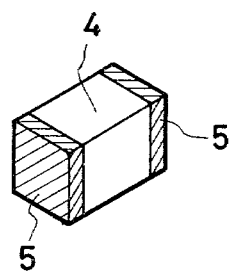
FIG. 5 is a perspective view showing the shape of the temperature compensating capacitor according to an embodiment of the present invention.
Figure 4:
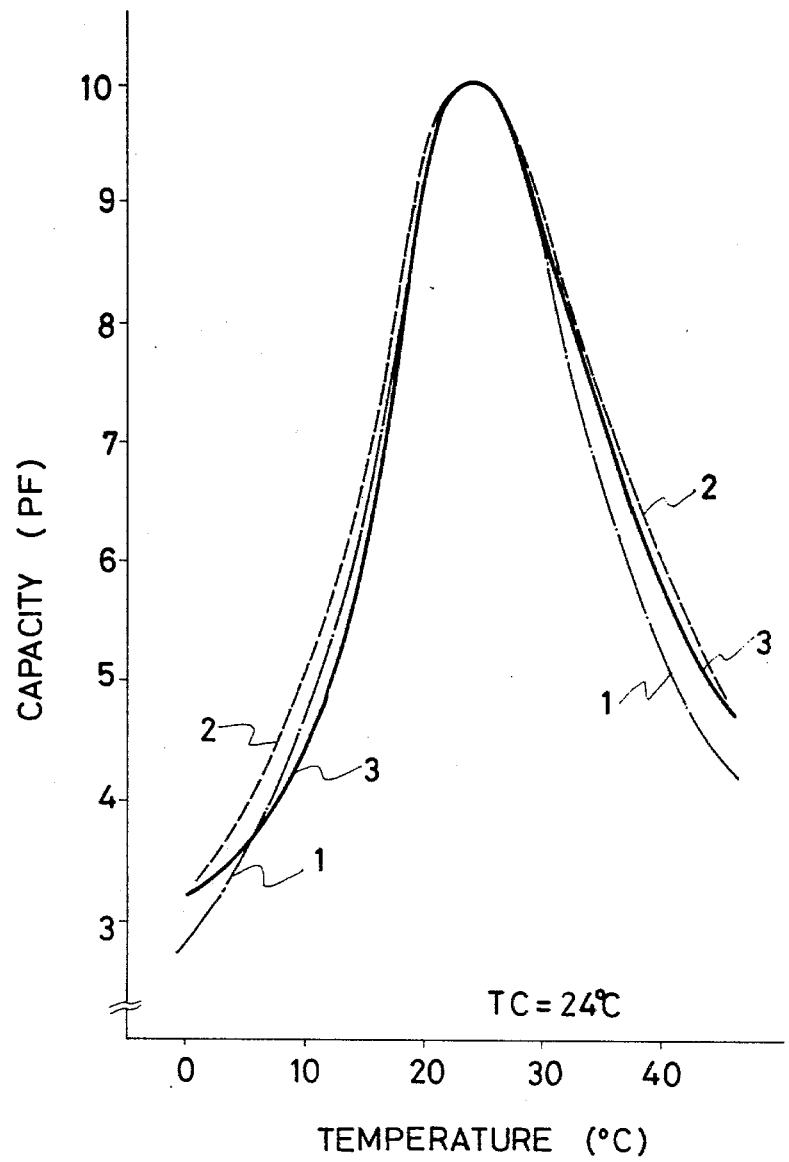
FIG. 4 is a characteristic diagram showing the variation of the capacitance-temperature characteristics of the typical materials of the temperature compensating capacitor.

FIG. 5 shows a perspective view of the temperature compensating capacitor. Electrodes 5 are ordinary silver electrodes and the predetermined capacitance is obtained by varying the area of the electrodes.

Figure 6:
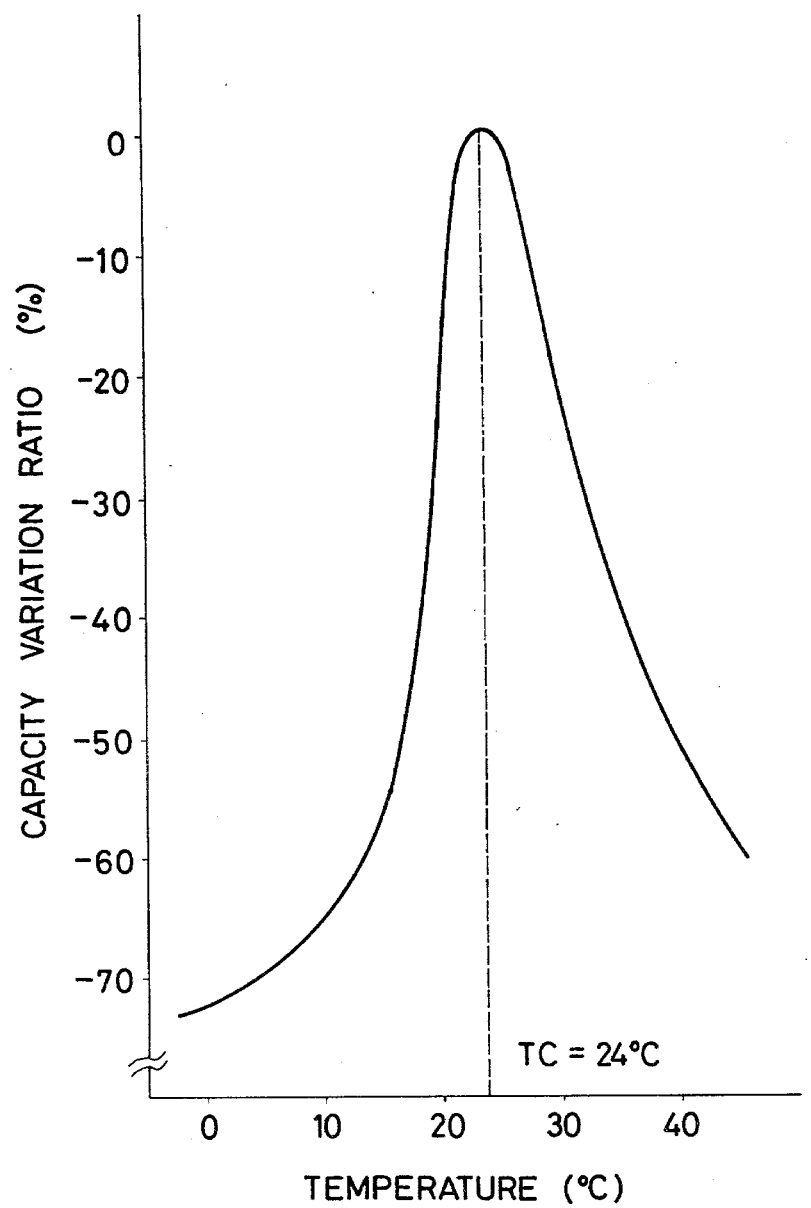
FIG. 6 is a characteristic diagram showing the capacitance-temperature characteristics of CDH according to an embodiment of the present invention.
Figure 7:
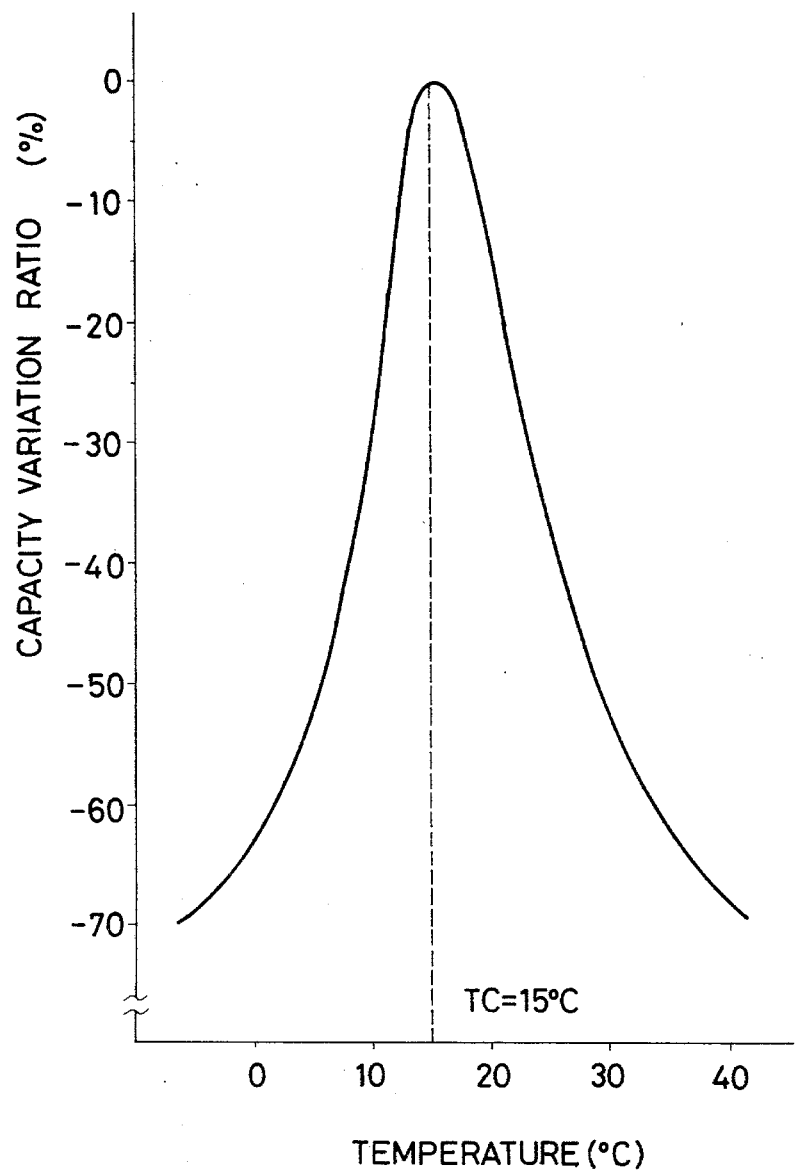
FIG. 7 is a characteristic diagram showing the capacitance-temperature characteristics of CDL according to an embodiment of the present invention.

FIGS. 6 and 7 show capacitance variation ratio curves the value of the temperature compensating capacitor obtained by the above mentioned method (calculated as a percent on the basis of the capacitance value at TC). FIG. 6 shows a characteristic of the temperature compensating capacitor element H (referred to CDH hereafter) whose TC is 24° C. FIG. 7 shows a characteristic of the temperature compensating capacitor L (referred to CDL hereafter) whose TC is 15° C.

Figure 8:
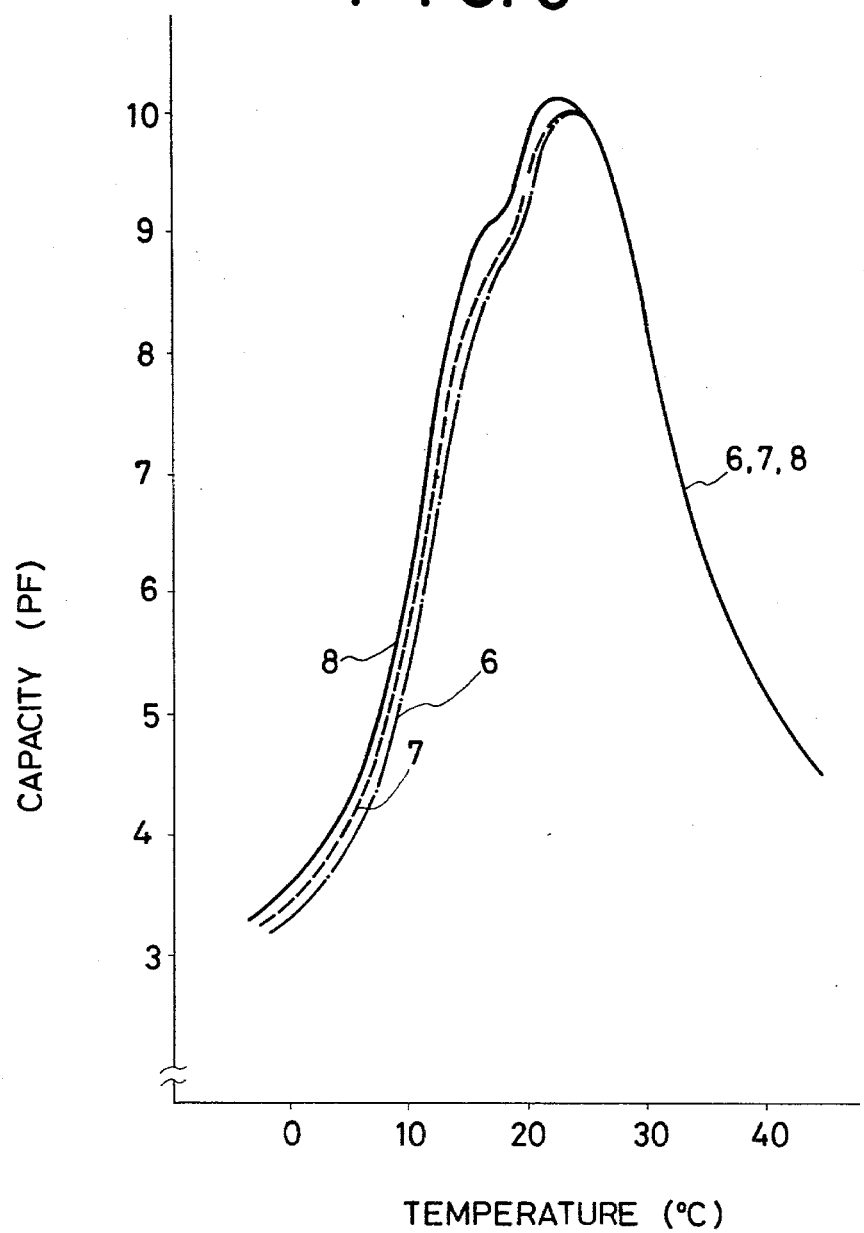
FIG. 8 is a characteristic diagram showing the combination of CDH and CDL according to an embodiment of the present invention.

FIG. 8 shows the capacitance-temperature characteristics of CDH and CDL adjusted to each of the capacitance shown in Table 1 and connected in parallel. In FIG. 8, since each of the capacitance-temperature characteristics almost overlap one another when the temperature is more than 24° C., the characteristics is shown by a single curve.

TABLE 1

| Combination No. | Capacitance of CDH at 24° C. (PF) | Capacitance of CDL at 24° C. (PF) |
|---|---|---|
| 1 | 5.6 | 4.4 |
| 2 | 6.6 | 3.4 |
| 3 | 4.6 | 5.4 |

Each combination is chosen so that the values may be 10 PF at 24° C.

Generally, in the case that the capacitor elements are connected parallel, i.e., the capacitor C1 and the capacitor C2 are connected in parallel and the value of the capacitor parallel combination is C1+C2. Actually, the combination of the capacitor elements CHD and CDL are 10 PF at 24° C. after connecting the first CDH and the second CDL in parallel as shown in FIG. 8.

Subsequently the combined first and second capacitors CDH and CDL are mounted on a circuit board.

Figure 9:
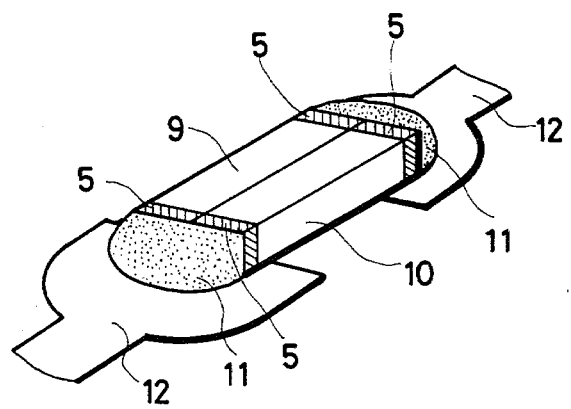
FIG. 9 is a perspective view showing the mounting condition of CDH and CDL according to an embodiment of the present invention.

FIG. 9 shows a perspective view of the mounting condition. The mounting method for CDH and CDL is the same as that of ordinary passive elements. CDH 9 and CDL 10 are fixed on electrode patterns 12 on a circuit board by solders 11 and are electrically connected in parallel. It is to be noted that the capacitor can be mounted on the circuit board by various methods other than the method mentioned above. The capacitor and the circuit board are easily made in one body and double-layered by making CDH and CDL in one body previously when the electrodes are attached and by the process of pressure fixing, drying and firing the green sheets of CDH and CDL.

Figure 10:
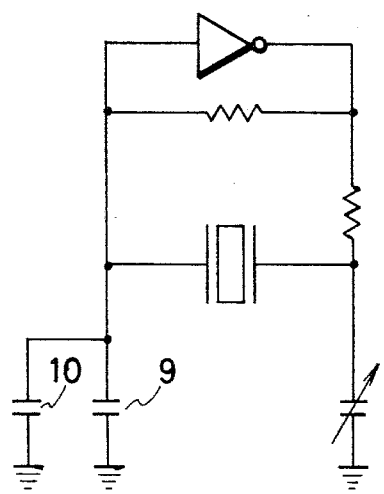
FIG. 10 is a circuit diagram showing a quartz crystal oscillating circuit according to an embodiment of the present invention.

FIG. 10 shows a piezoelectric quartz crystal oscillating circuit mounted as shown in FIG. 9.

Figure 11:
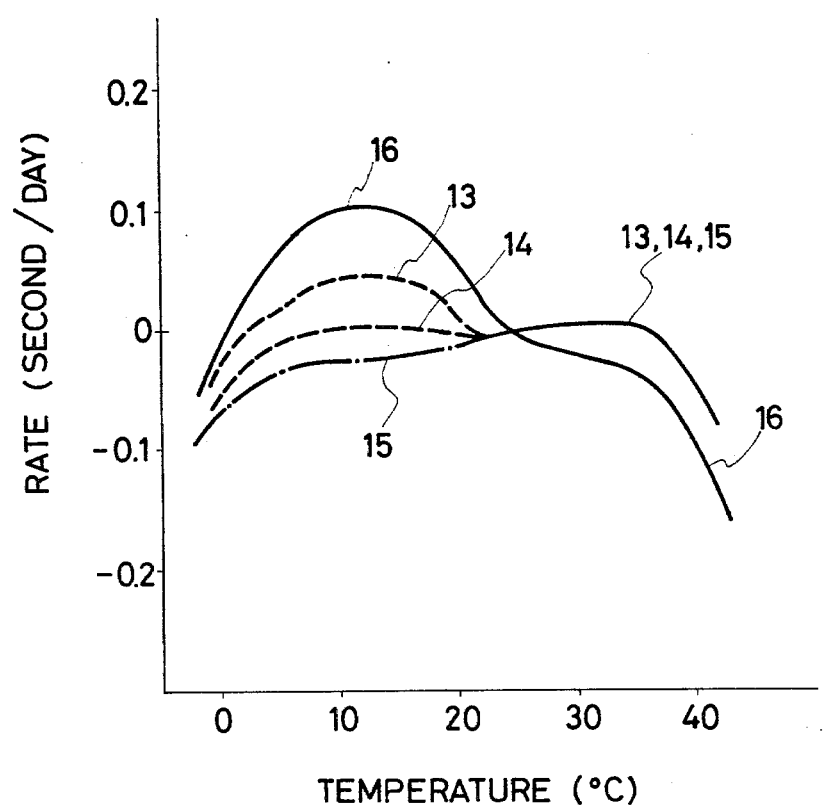
FIG. 11 is a characteristic diagram showing the rate-temperature characteristics of CDH and CDL being combined according to an embodiment of the present invention and the rate-temperature characteristics according to the conventional compensating method.

FIG. 11 shows the rate-temperature characteristics when TP of the X-cut quartz crystal resonator of FIG. 10 is 22° C. and the combination of CDH and CDL is the value shown in Table 1.

In FIG. 11, curves 13, 14 and 15 respecively show the combination No. 1, Nos. 2 and No. 3 in Table 1. A curve 16 show the conventional temperature compensating capacitor whose TC is 22° C. and the capacitance at 24° C. is 10 PF. The curves 13, 14 and 15 are shown by a single curve since the rate-temperature characteristics almost overlap one another above 24° C.

The rate-temperature resulting from combining CDH and CDL according to the present invention all exceedingly excellent, as shown in FIG. 11. Namely, the rate of ±0.1 second/day is sufficiently satisfied in the range of room temperature ±20° C., whereby the rate-temperature characteristics are improved in a large scale in comparison with the curve 16 showing the conventional temperature compensating capacitor.

The capacitance-temperature characteristics of the material of the temperature compensating capacitor are asymmetrical centering around TC. Therefore, in the case that the X-cut quartz crystal resonator and the temperature compensating capacitor are mounted on the circuit board and coinciding TP and TC, a capacitance of the temperature compensating capacitor is lacking at the lower temperature side of TP, and the rates at the higher temperature side of TP coincide, since the frequency-temperature characteristics of the X-cut resonator are symmetrical centering around TP, and as a result the rate gains. On this occasion, the rate may be adjusted at a suitable value if the supplementary temperature compensating capacitor element having TC in the temperature range where the capacitance is lacking is connected in parallel with the capacitance to add the capacity. Though TC of the first capacitor CDH is 24° C. and TC of the second capacitor CDL is 15° C. in this embodiment, the capacitor elements are suitably settled according to the frequency-temperature characteristics of the X-cut quartz crystal resonator and the capacitance-temperature characteristics of the temperature compensating capacitor elements. As shown by FIGS. 6 and 7, the first capacitor CDH has a value of TC selected so that its range of positive temperature characteristic, i.e. at temperatures less than TC, lies within a portion of the temperature range within which the oscillator circuit is generally used. On the other hand, the second capacitor CDL has a value of TC selected so that its range of negative temperature characteristic, i.e. at temperatures greater than TC, lies within a portion of the temperature range within which the first capacitor exhibits a positive temperature characteristic, i.e. between TC of the first and second capacitors, and within a portion of the temperature range within which the oscillator circuit is generally used. It is to be noted that the other characteristics such as dielectric loss and conductance required of a capacitor are not deteriorated by using two temperature compensating capacitor elements in comparison with the conventional type using a single temperature compensating capacitor. Further, since the ceramic chip may be exceedingly miniaturized, the space occupied by mouting two temperature compensating capacitor elements as shown in FIG. 9 is reduced. Moreover, it is easy to combine more than two capacitor elements.

As illustrated, a high precision timepiece is provided at a low cost according to the present invention and the present invention can be applied to a micro timepiece.

I claim:

1. An oscillator circuit comprising: an X-cut quartz crystal resonator having a negative secondary temperature coefficient; an amplifer for driving said crystal resonator to oscillate; and a plurality of temperature compensating capacitors connected for compensating for temperature variations, said plurality of temperature compensating capacitors each comprising a ferroelectric material and each of said temperature compensating capacitors having different respective Curie Point temperatures, and the respective peak capacitance values of each of said temperature compensating capacitors and the Curie Point temperatures being selected to achieve a frequency-temperature characeristic curve of the oscillator circuit having a minimized rate of change of frequency per degree of temperature change.

2. An oscillator circuit as claimed in claim 1; wherein said temperature compensating capacitors are comprised of ferroelectric ceramics.

3. An oscillator circuit as claimed in claim 2; wherein the principal component of said ferroelectric ceramics is $BaTiO_3$.

4. An oscillator circuit as claimed in claim 3; wherein another component of said ferroelectric ceramics is SrTiO$_3$.

5. An oscillator circuit as claimed in claim 4; wherein said X-cut quartz crystal resonator has a turning point temperature of about 22° C., wherein a Curie Point temperature of one of said temperature compensating capacitors is about 24° C., and wherein the Curie Point temperature of another of said temperature compensating capacitors is about 15° C.

6. An oscillator circuit as claimed in claim 1, 2, 3, 4 or 5; wherein at least a pair of said temperature compensating capacitors are connected in parallel.

7. In an oscillator circuit, the combination comprising: an X-cut quartz crystal resonator having a negative secondary temperature coefficient; an amplifier circuit connected for driving said X-cut quartz crystal resonator to oscillate; and a plurality of temperature compensating capacitors connected to said amplifier circuit, said capacitors having temperature characteristics exhibiting positive temperature characteristics and negative temperature characteristics, wherein a first of said capacitors exhibits a positive temperature characteristic within a portion of a temperature range within which the oscillator circuit is generally used, and wherein a second of said capacitors exhibits a negative temperature characteristic within a portion of the temperature range within which said first capacitor exhibits a positive temperature characteristic and within a portion of the temperature range within which the oscillator circuit is generally used.

8. In an oscillator circuit according to claim 7, said first capacitor is connected to the input of said amplifier circuit, and said second capacitor is connected to the input of said amplifier circuit and in parallel with said first capacitor.

9. In an oscillator circuit according to claim 7 or 8, wherein said X-cut quartz crystal resonator has a turning point temperature of about 22° C., said first capacitor is comprised of a ferroelectric material having a Curie Point temperature of about 24° C., and said second capacitor is comprised of a ferroelectric material having a Curie Point temperature of about 15° C.

10. In an oscillator circuit according to claim 7, wherein said first and second capacitors are connected in parallel.

11. An oscillator circuit, comprising: an X-cut quartz crystal resonator having a negative secondary temperature coefficient and temperature-frequency characteristics generally symmetrical about a turning point temperature of the X-cut quartz crystal resonator temperature-frequency characteristics; an amplifier circuit connected for driving said X-cut quartz crystal resonator to oscillate; and a plurality of temperature compensating capacitors connected to said amplifier circuit, said capacitors each comprising a ferroelectric material and said capacitors having different respective Curie Point temperatures, and a first of said capacitors having a Curie Point temperature higher than the turning point temperature of the piezoelectric resonator temperature-frequency characteristics and a second of said capacitors having a Curie Point temperature lower than the turning point temperature of the piezoelectric resonator temperature-frequency characteristics.

12. An oscillator circuit according to claim 11, whereinsaid first capacitor is connected to the input of said amplifier circuit, and said second capacitor is connected to the input of said amplifier circuit and in parallel with said first capacitor.

13. An oscillator circuit according to claim 11 or 12, wherein said X-cut quartz crystal resonator has a turning point temperature of about 22° C., said first capacitor has a Curie Point temperature of about 24° C., and said second capacitor has a Curie Point temperature of about 15° C.

14. An oscillator circuit according to claim 11, wherein said first and second capacitors are connected in parallel.

* * * * *